(12) United States Patent
Chen

(10) Patent No.: US 7,361,972 B2
(45) Date of Patent: Apr. 22, 2008

(54) CHIP PACKAGING STRUCTURE FOR IMPROVING RELIABILITY

(75) Inventor: Hsien-Wei Chen, Singing (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 38 days.

(21) Appl. No.: 11/385,920

(22) Filed: Mar. 20, 2006

(65) Prior Publication Data

US 2007/0215985 A1 Sep. 20, 2007

(51) Int. Cl.
*H01L 29/06* (2006.01)

(52) U.S. Cl. .................. 257/622; 257/707; 257/778; 438/108; 438/122

(58) Field of Classification Search .......... 257/622, 257/706, 707, 713, 778; 438/108, 122
See application file for complete search history.

(56) References Cited

U.S. PATENT DOCUMENTS

| 5,403,783 | A | * | 4/1995 | Nakanishi et al. | .......... 438/106 |
| 5,668,404 | A | * | 9/1997 | Abe et al. | .......... 257/668 |
| 7,022,587 | B2 | * | 4/2006 | Konnemann | .......... 438/462 |
| 7,029,951 | B2 | * | 4/2006 | Chen et al. | .......... 438/122 |
| 2005/0127500 | A1 | * | 6/2005 | Colgan et al. | .......... 257/706 |
| 2006/0209516 | A1 | * | 9/2006 | Chengalva et al. | .......... 361/719 |
| 2006/0278974 | A1 | * | 12/2006 | Hsiao et al. | .......... 257/706 |

* cited by examiner

*Primary Examiner*—S. V. Clark
(74) *Attorney, Agent, or Firm*—Tung & Associates

(57) ABSTRACT

A novel chip packaging structure is disclosed. The chip packaging structure includes a flip chip having a chip backside, at least one concave stress-relieving structure provided in the chip backside, a carrier substrate bonded to the flip chip and an adhesive material interposed between the flip chip and the carrier substrate. During thermal testing and/or functioning of the flip chip, the stress-relieving structure reduces stresses between the flip chip and the carrier substrate and dissipates heat from the flip chip to reduce thermally-induced delamination stresses applied to the adhesive material and thereby enhances reliability of the flip chip.

20 Claims, 3 Drawing Sheets

CHIP PACKAGING STRUCTURE FOR IMPROVING RELIABILITY

FIELD OF THE INVENTION

The present invention relates to flip chip packaging of integrated circuit (IC) semiconductor assemblies. More particularly, the present invention relates to a novel IC chip package structure which utilizes openings, slots or a meshwork of channels to dissipate heat and enhance thermal transference efficiency between an IC (integrated circuit) device and a PCB (printed circuit board) substrate.

BACKGROUND OF THE INVENTION

One of the last processes in the production of semiconductor integrated circuits (IC) is multi-leveled packaging, which includes expanding the electrode pitch of the IC chips containing the circuits for subsequent levels of packaging; protecting the chip from mechanical and environmental stress; providing proper thermal paths for channeling heat dissipated by the chip; and forming electronic interconnections. The manner in which the IC chips are packaged dictates the overall cost, performance, and reliability of the packaged chips, as well as of the system in which the package is applied.

Package types for IC chips can be broadly classified into two groups: hermetic-ceramic packages and plastic packages. A chip packaged in a hermetic package is isolated from the ambient environment by a vacuum-tight enclosure. The package is typically ceramic and is utilized in high-performance applications. A chip packaged in a plastic package, on the other hand, is not completely isolated from the ambient environment because the package is composed of an epoxy-based resin. Consequently, ambient air is able to penetrate the package and adversely affect the chip over time. Recent advances in plastic packaging, however, have expanded their application and performance capability. Plastic packages are cost-effective due to the fact that the production process is typically facilitated by automated batch-handling.

A recent development in the packaging of IC chips is the ball grid array (BGA) package, which may be utilized with either ceramic packages or plastic packages and involves different types of internal package structures. The BGA package uses multiple solder balls or bumps for electrical and mechanical interconnection of IC chips to other microelectronic devices. The solder bumps serve to both secure the IC chip to a circuit board and electrically interconnect the chip circuitry to a conductor pattern formed on the circuit board. The BGA technique is included under a broader connection technology known as "Controlled Collapse Chip Connection-C4" or "flip-chip" technology.

Flip chip technology can be used in conjunction with a variety of circuit board types, including ceramic substrates, printed wiring boards, flexible circuits, and silicon substrates. The solder bumps are typically located at the perimeter of the flip chip on electrically conductive bond pads that are electrically interconnected with the circuitry on the flip chip. Because of the numerous functions typically performed by the microcircuitry of a flip chip, a relatively large number of solder bumps are often required. The size of a flip chip is typically on the order of about thirteen millimeters per side, resulting in crowding of the solder bumps along the perimeter of the flip chip. Consequently, flip chip conductor patterns are typically composed of numerous individual conductors that are often spaced apart about 0.1 millimeter or less.

FIG. 1 illustrates a cross-section of a conventional BGA integrated circuit (IC) package structure 10 having a die or flip chip 16 which is inverted and bonded to a carrier substrate 12, such as a printed circuit board (PCB), for example. Multiple solder balls 14 are attached to the carrier substrate 12 to facilitate electrical connection of the carrier substrate 12 to higher-order electronic structures (not shown). Fabrication of the flip chip 16 is begun by forming multiple bonding pads 18 on the surface of a chip substrate 17, in electrical contact with integrated circuits (not shown) previously fabricated on the chip substrate 17. A solder bump 20 is then bonded to each of the bonding pads 18. Each of the solder bumps 20 is typically spherical in configuration and extends through a passivation layer (not shown) formed on the surface of the chip substrate 17. A tin oxide layer (not shown) may coat the surface of each solder bump 20.

In assembly of the IC package structure 10, the flip chip 16 is subjected to a re-flow temperature of typically about 320° C. to re-flow the lead solder bumps 20 on the chip substrate 17. The flip chip 16 is then inverted and the solder bumps 20 are bonded with respective bond pads (not shown) on the carrier substrate 12. The re-flow heat partially melts the tin oxide layer (not shown) on the solder bumps 20 and bonds the underlying lead solder bumps 20 to the carrier substrate 12.

In an underfill process, an adhesive material 22, such as an epoxy, for example, is provided between the carrier substrate 12 and the chip substrate 17. The hardened adhesive material 22, which typically has a high Young's modulus, attaches the flip chip 16 to the carrier substrate 12 and protects the solder bumps 20 from cracking in the finished IC package structure 10. The material characteristics of the adhesive material 22 are important for optimum adhesion of the flip chip 16 to the carrier substrate 12 and thermal insulation.

After the flip chip 16 is attached to the carrier substrate 12 and the adhesive material 22 is injected between the flip chip 16 and the carrier substrate 12, the IC package structure 10 is subjected to a variety of tests such as, for example, reliability tests in which the IC package structure 10 is heated to test the reliability of electrical interconnections between the flip chip 16 and the carrier substrate 12. Furthermore, during functioning of the flip chip 16 in an electronic apparatus (not shown) of which the flip chip 16 is a part, heat is generated between the flip chip 16 and the carrier substrate 12. This causes the flip chip 16 and the carrier substrate 12 to thermally expand with respect to each other. Because they have different coefficients of thermal expansion (CTE), however, the flip chip 16 and the carrier substrate 12 expand at different rates. Consequently, the resulting stress placed upon the solder bumps 20 and adhesive material 22 frequently causes interfacial delamination of the adhesive material 22. This results in lower reliability of the flip chip 16.

Accordingly, a novel chip packaging structure and method is needed for improving chip reliability by relieving physical stresses and facilitating dissipation of heat from a flip chip during flip chip testing and functioning.

An object of the present invention is to provide a novel IC chip package structure for improving chip reliability.

Another object of the present invention is to provide a novel IC chip package structure in which delamination stress caused by different coefficients of thermal expansion (CTE) between a flip chip and a carrier substrate is reduced.

Still another object of the present invention is to provide a novel IC chip package structure in which multiple concave structures, such as a set of openings or channels or a channel matrix, for example, is/are provided in the backside of an IC flip chip or die to enhance dissipation of heat from the flip chip and reduce stress between the flip chip and a carrier substrate to which the flip chip is bonded.

Yet another object of the present invention is to provide a novel method for reducing delamination stress between an IC flip chip and a carrier substrate in an IC package structure.

SUMMARY OF THE INVENTION

In accordance with these and other objects and advantages, the present invention is generally directed to a novel IC chip package structure having an IC flip chip or die bonded to a carrier substrate. An adhesive material such as epoxy is sandwiched between the flip chip and the carrier substrate. Multiple concave stress-relieving structures, such as a set of stress relief openings or slots or a channel matrix, for example, are provided in the backside of the IC flip chip. During thermal testing and/or functioning of the flip chip, the concave structures reduce stresses between the flip chip and the carrier substrate and dissipate heat from the flip chip to reduce thermally-induced delamination stresses applied to the adhesive material and enhance reliability of the flip chip.

The present invention is further directed to a novel method for reducing thermally-induced delamination stresses between an IC flip chip and a carrier substrate in an IC package structure. The method includes providing an IC flip chip, providing multiple concave structures in the backside of the flip chip, bonding the flip chip to a carrier substrate, and providing an adhesive material between the flip chip and the carrier substrate.

BRIEF DESCRIPTION OF THE DRAWINGS

The invention will now be described, by way of example, with reference to the accompanying drawings, in which.

DETAILED DESCRIPTION OF THE INVENTION

The present invention contemplates a novel IC chip package structure in which multiple solder bumps of an IC flip chip or die are bonded to a carrier substrate such as a printed circuit board (PCB). An adhesive material such as epoxy is sandwiched between the flip chip and the carrier substrate. According to the invention, concave stress-relieving structures are provided in the backside of the IC flip chip. In one embodiment, the stress-relieving structures are stress relief openings. In another embodiment, the stress-relieving structures are stress relief slots. In still another embodiment, the stress-relieving structures are stress-relief channels which are arranged in a symmetrical channel matrix. In yet another embodiment, the stress-relieving structures are stress-relief channels which arranged in an asymmetrical channel matrix. During thermal testing and/or functioning of the flip chip, the stress-relieving structures reduce stresses between the flip chip and the carrier substrate and dissipate heat from the flip chip to reduce thermally-induced delamination stresses applied to the adhesive material and thereby enhance reliability of the flip chip.

The present invention is further directed to a novel method for reducing thermally-induced delamination stresses between an IC flip chip and a carrier substrate in an IC package structure. The method includes providing an IC flip chip, providing multiple concave stress-relieving structures in the backside of the flip chip, bonding the flip chip to a carrier substrate, and providing an adhesive material between the flip chip and the carrier substrate.

Figure 1:
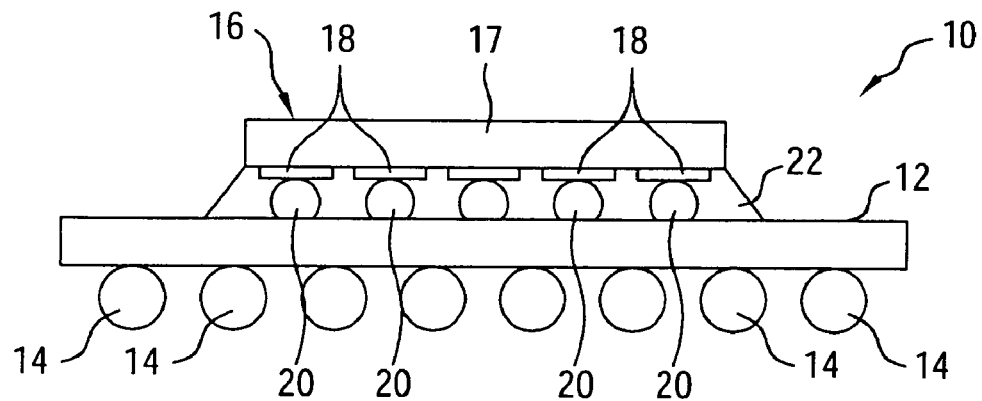
FIG. 1 is a cross-section of a conventional IC package structure.
Figure 2:
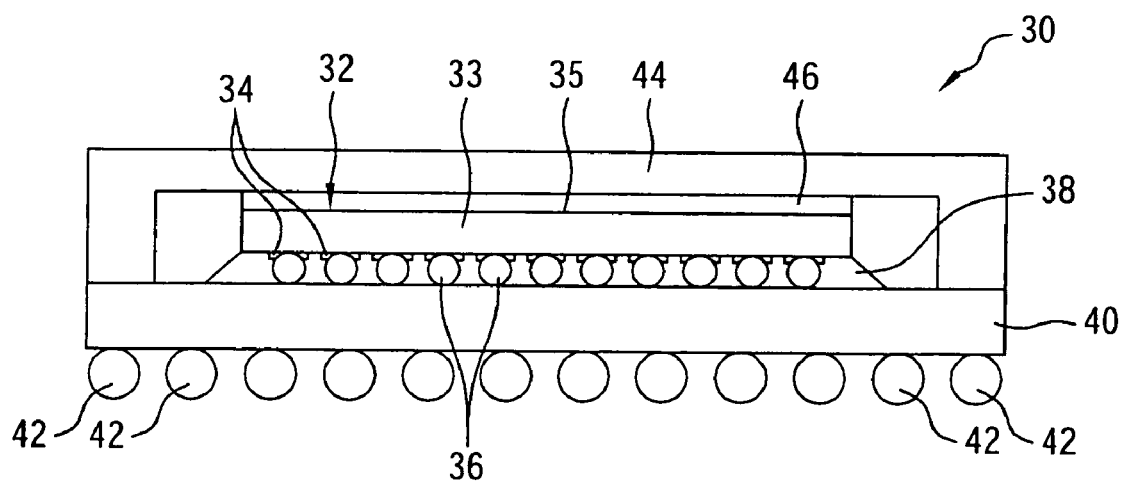
FIG. 2 is a cross-section of an IC package structure according to the present invention.

Referring initially to FIG. 2 of the drawings, an IC package structure according to the present invention is generally indicated by reference numeral 30. The IC package structure 30 includes a die or flip chip 32 having a chip substrate 33 on which integrated circuits (not shown) have previously been sequentially fabricated throughout a semiconductor fabrication process. Multiple bonding pads 34 are provided on the flip chip 32 in electrically-conductive contact with the integrated circuits. Solder bumps 36 are formed on the respective bonding pads 34. The chip substrate 33 has a chip backside 35 which is opposite the side on which the bonding pads 34 and solder bumps 36 are provided. According to the present invention, concave stress-relieving structures, which will be hereinafter described, are provided in the chip backside 35.

The solder bumps 36 are bonded to respective bond pads (not shown) provided on one surface of a carrier substrate 40, which may be a printed circuit board (PCB), for example. Multiple solder balls 42 are provided on the opposite surface of the carrier substrate 40 to facilitate electrical attachment of the carrier substrate 40 to higher-order electronic structures (not shown) in an electronic apparatus. The flip chip 32 and carrier substrate 40 typically have different coefficients of thermal expansion (CTE).

During fabrication of the IC package structure 30, an adhesive material 38, such as epoxy, for example, is injected between the flip chip 32 and the carrier substrate 40 after the solder bumps 36 are bonded to the carrier substrate 40. The adhesive material 38 promotes adhesion between the flip chip 32 and the carrier substrate 40. An outer package structure 44, such as a laminated film, for example, is provided on the exterior of the IC package structure 30. A thermal compound 46 is typically interposed between the chip backside 35 and the outer package structure 44 to promote the dissipation of thermal energy from the flip chip 32. During reliability testing and functioning of the flip chip 32, heat which is generated by the flip chip 32 tends to cause thermal expansion of the chip substrate 33 and carrier substrate 40 at different expansion rates. As will be hereinafter described, the stress-relieving structures in the chip backside 35 relieve stress and increase the surface area of contact between the chip substrate 33 and the thermal compound 46, promoting dissipation of heat during testing and functioning of the flip chip 32. This helps prevent or reduce delamination of the adhesive material 38.

Figure 3:
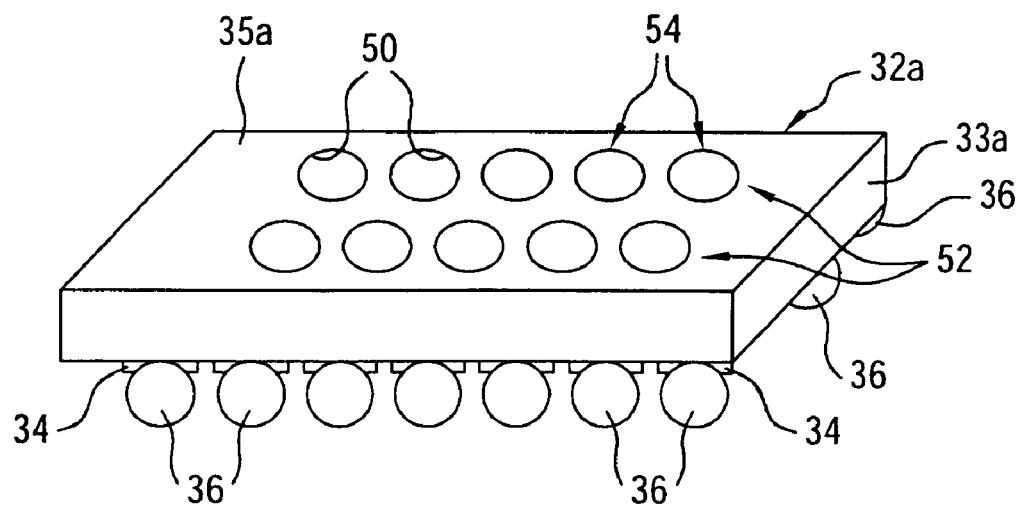
FIG. 3 is a top perspective view of an IC flip chip with a set of multiple openings in the backside surface thereof according to one embodiment of the IC package structure of the present invention.

Referring next to FIG. 3, in one embodiment of the IC package structure 30, the concave stress-relieving structures include multiple stress relief openings 50 which are provided in the chip backside 35a of the flip chip 32a. The stress relief openings 50 may be arranged in multiple rows 52 and intersecting columns 54, as shown in FIG. 3, or in any alternative pattern. The stress relief openings 50 may be formed in the chip backside 35a using etching or other techniques known by those skilled in the art. Preferably, each stress relief opening 50 has a depth of typically about 5~50 µm. Accordingly, during reliability testing and functioning of the flip chip 32a, the stress relief openings 50 relieve expansion stresses caused by thermal expansion of the flip chip 32a. Furthermore, the stress relief openings 50 present an increased surface area of contact between the chip substrate 35a with the thermal compound 46, thus facilitating the dissipation of thermal energy from the flip chip 32a. Therefore, the adhesive material 38 is subjected to a reduced level of stress caused by different thermal expansion rates of the flip chip 32 and the carrier substrate 40. Consequently, delamination of the adhesive material 38 is prevented or substantially reduced, and reliability of the flip chip 32 is enhanced.

Figure 4:
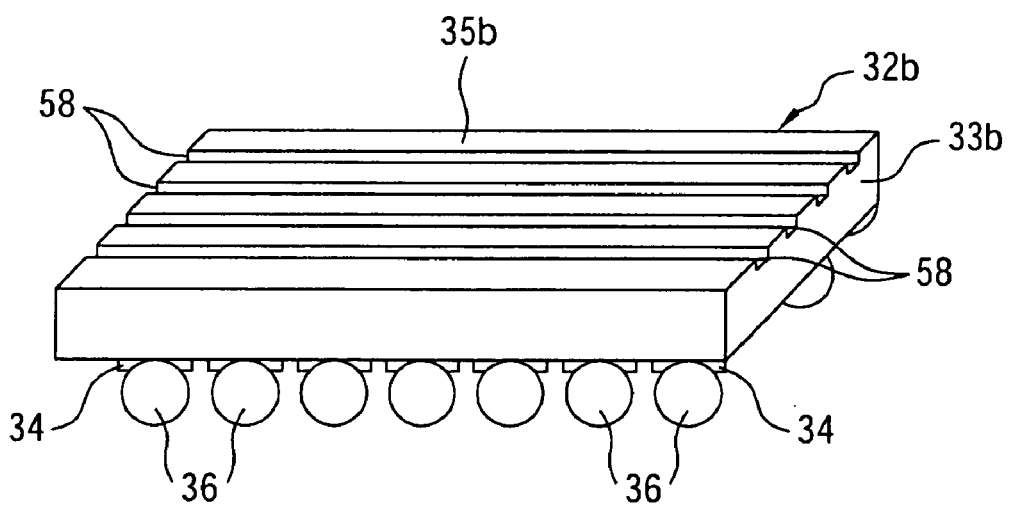
FIG. 4 is a top perspective view of an IC flip chip with a set of multiple channels in the backside surface thereof according to another embodiment of the IC package structure of the present invention.
Figure 5:
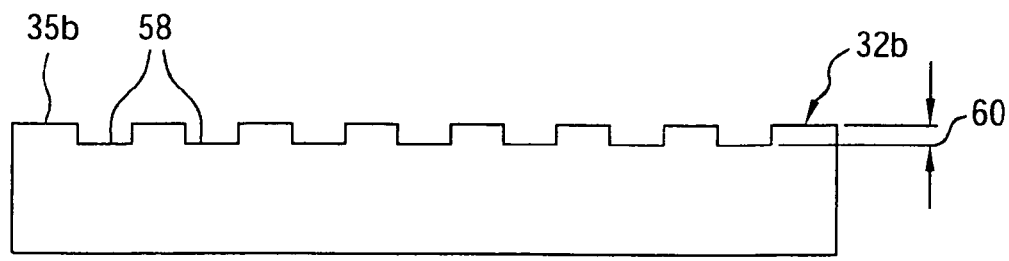
FIG. 5 is a cross-section of the IC flip chip of FIG. 4.

Referring next to FIGS. 4 and 5, in another embodiment of the package structure 30, the concave stress-relieving structures include multiple stress relief slots 58 which are provided in the chip backside 35b. The stress relief slots 58 typically extend along the chip backside 35b in parallel, spaced-apart relationship with respect to each other.

As shown in FIG. 5, each stress relief slot 58 has a slot depth 60 of preferably about 5~50 µm.

Figure 6:
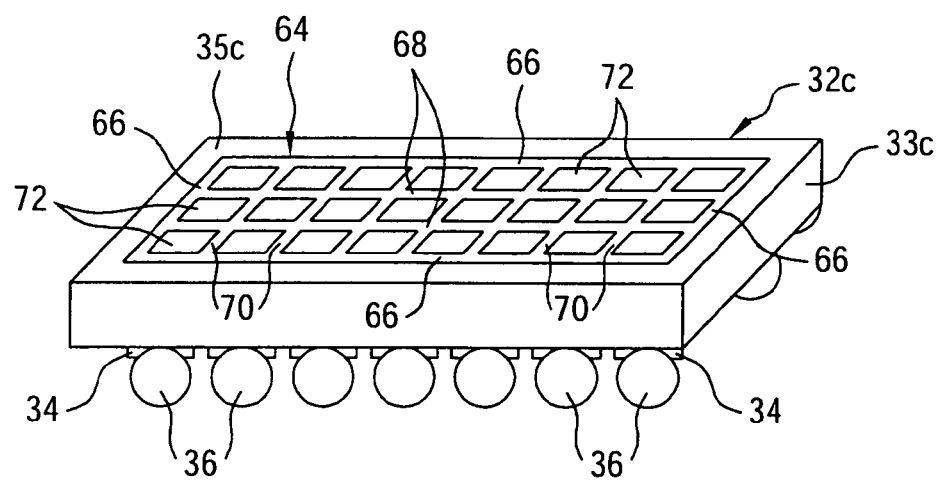
FIG. 6 is a top perspective view of an IC flip chip with a channel matrix in the backside surface thereof according to still another embodiment of the IC package structure of the present invention.

Referring next to FIG. 6, in still another embodiment of the package structure 30, the concave stress-relieving structures include a symmetrical channel matrix 64 which is provided in the chip backside 35c of the chip substrate 33b of the flip chip 35. The symmetrical channel matrix 64 typically includes a continuous perimeter channel 66 which extends adjacent to the edges of the chip substrate 33b. Multiple longitudinal channels 68 and intersecting transverse channels 70 typically span the perimeter channel 66, forming islands 72. Each of the perimeter channel 66, longitudinal channels 68 and transverse channels 70 of the symmetrical channel matrix 64 preferably has a depth of typically about 5~50 µm.

Figure 7:
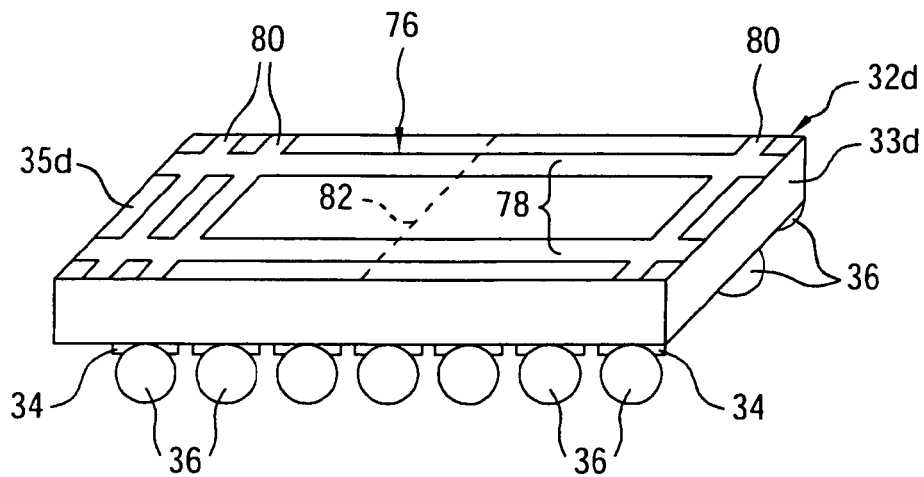
FIG. 7 is a top perspective view of an IC flip chip with a set of asymmetrical channels in the backside surface thereof according to yet another embodiment of the IC package structure of the present invention.

Referring next to FIG. 7, in yet another embodiment of the package structure 30, the concave stress-relieving structures include an asymmetrical channel matrix 76 which is provided in the chip backside 35d of the chip substrate 33d. The asymmetrical channel matrix 76 is particularly effective in relieving two-dimensional stresses along the x and y axes. The asymmetrical channel matrix 76 typically includes multiple, parallel longitudinal channels 78 and multiple, parallel transverse channels 80 which intersect the longitudinal channels 78. An imaginary middle axis 82 divides the chip backside 35d into regions of equal area. The transverse channels 80 are more numerous on one side of the middle axis 82 than on the opposite side of the middle axis 82. Each of the longitudinal channels 78 and the transverse channels 80 preferably has a depth of typically about 5~50 µm.

While the preferred embodiments of the invention have been described above, it will be recognized and understood that modifications can be made in the invention and the appended claims are intended to cover all such modifications which may fall within the spirit and scope of the invention.

What is claimed is:

1. A chip packaging structure comprising:
   a flip chip having a chip backside;
   at least one concave stress-relieving structure provided in said chip backside;
   a carrier substrate bonded to said flip chip;
   an adhesive material interposed between said flip chip and said carrier substrate; and,
   an outer package structure comprising a thermal compound, said thermal compound interposed between the chip backside and the outer package structure, said at least one concave stress-relieving structure increasing a contact surface area between said chip backside and said thermal compound to promote heat dissipation.

2. The chip packaging structure of claim 1 wherein said at least one concave stress-relieving structure comprises a plurality of stress relief openings.

3. The chip packaging structure of claim 2 wherein said stress relief openings are arranged in a plurality of intersecting rows and columns.

4. The chip packaging structure of claim 1 wherein said at least one concave stress-relieving structure comprises a plurality of stress relief slots.

5. The chip packaging structure of claim 4 wherein said stress relief slots are arranged in substantially parallel relationship to each other.

6. The chip packaging structure of claim 1 wherein said at least one concave stress-relieving structure comprises a symmetrical channel matrix.

7. The chip packaging structure of claim 6 wherein said symmetrical channel matrix comprises a perimeter channel, a plurality of longitudinal channels spanning said perimeter channel, a plurality of transverse channels spanning said perimeter channel and intersecting said plurality of longitudinal channels, and a plurality of islands defined between said longitudinal channels and said transverse channels.

8. The chip packaging structure of claim 1 wherein said at least one concave stress-relieving structure comprises an asymmetrical channel matrix.

9. The chip packaging structure of claim 8 wherein said asymmetrical channel matrix comprises a plurality of longitudinal channels and a plurality of transverse channels intersecting said plurality of longitudinal channels, and wherein said transverse channels are more numerous on one side of a middle axis dividing said chip backside into substantially equal areas than on an opposite side of said middle axis.

10. A chip packaging structure comprising:
    a flip chip having a chip backside;
    a plurality of concave stress-relieving structures each having a depth of from about 5 µm to about 50 µm provided in said chip backside;
    a carrier substrate bonded to said flip chip;
    an adhesive material interposed between said flip chip and said carrier substrate; and,
    an outer package structure comprising a thermal compound, said thermal compound interposed between the chip backside and the outer package structure, said at least one concave stress-relieving structure increasing a contact surface area between said chip backside and said thermal compound to promote heat dissipation.

11. The chip packaging structure of claim 10 wherein said plurality of concave stress-relieving structures comprises a plurality of stress relief openings arranged in a plurality of intersecting rows and columns.

12. The chip packaging structure of claim 10 wherein said plurality of concave stress-relieving structures comprises a plurality of stress relief slots arranged in substantially parallel relationship to each other.

13. The chip packaging structure of claim 10 wherein said plurality of concave stress-relieving structures comprises a symmetrical channel matrix comprising a perimeter channel, a plurality of longitudinal channels spanning said perimeter channel, a plurality of transverse channels spanning said perimeter channel and intersecting said plurality of longitudinal channels, and a plurality of islands defined between said longitudinal channels and said transverse channels.

14. The chip packaging structure of claim 10 wherein said plurality of concave stress-relieving structures comprises an asymmetrical channel matrix comprising a plurality of longitudinal channels and a plurality of transverse channels intersecting said plurality of longitudinal channels, and wherein said transverse channels are more numerous on one side of a middle axis dividing said chip backside into substantially equal areas than on an opposite side of said middle axis.

15. A method of reducing thermally-induced delamination stresses between an integrated circuit flip chip and a carrier substrate in an integrated circuit package structure, comprising:
    providing a flip chip having a chip backside;
    providing a plurality of concave stress-relieving structures in said chip backside of said flip chip;
    providing a carrier substrate;
    bonding said flip chip to said carrier substrate;
    providing an adhesive material between said flip chip and said carrier substrate; and,
    providing an outer package structure comprising a thermal compound, said thermal compound interposed between the chip backside and the outer package structure, said at least one concave stress-relieving structure increasing a contact surface area between said chip backside and said thermal compound to promote heat dissipation.

16. The method of claim 15 wherein said providing a plurality of concave stress-relieving structures in said chip backside comprises providing a plurality of stress relief openings in said chip backside in a plurality of intersecting rows and columns.

17. The method of claim 15 wherein said providing a plurality of concave stress-relieving structures in said chip backside comprises providing a plurality of stress relief slots in said chip backside in substantially parallel relationship to each other.

18. The method of claim 17 wherein each of said stress relief slots has a depth of from about 5 µm to about 50 µm.

19. The method of claim 15 wherein said providing a plurality of concave stress-relieving structures in said chip backside comprises providing a symmetrical channel matrix in said chip backside.

20. The method of claim 15 wherein said providing a plurality of concave stress-relieving structures in said chip backside comprises providing an asymmetrical channel matrix in said chip backside.

* * * * *